United States Patent
Lee et al.

(10) Patent No.: US 8,045,081 B2
(45) Date of Patent: Oct. 25, 2011

(54) LIQUID CRYSTAL DISPLAY DEVICE WITH PHOTOSENSOR AND METHOD OF FABRICATING THE SAME

(75) Inventors: Kyung Eon Lee, Gyeonggi-Do (KR); Myoung Kee Baek, Gyeonggi-Do (KR); Han Wook Hwang, Gyeongsangbuk-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/832,233

(22) Filed: Jul. 8, 2010

(65) Prior Publication Data

US 2010/0330713 A1      Dec. 30, 2010

Related U.S. Application Data

(62) Division of application No. 12/003,043, filed on Dec. 19, 2007, now Pat. No. 7,787,065.

(30) Foreign Application Priority Data

Dec. 22, 2006  (KR) .............................. P2006-132307
Oct. 1, 2007   (KR) .............................. P2007-098685

(51) Int. Cl.
*G02F 1/136*   (2006.01)
*G09G 3/36*    (2006.01)
*H01L 29/04*   (2006.01)

(52) U.S. Cl. ................ 349/43; 349/42; 349/47; 345/92; 257/59; 257/72

(58) Field of Classification Search .............. 349/42–47; 345/92; 257/59, 72
See application file for complete search history.

(56) References Cited

U.S. PATENT DOCUMENTS

| | | | |
|---|---|---|---|
| 4,889,826 A | 12/1989 | Ohta | 437/40 |
| 5,744,822 A | 4/1998 | Takayama et al. | 257/66 |
| 5,779,918 A | 7/1998 | Inoue et al. | 216/2 |
| 5,824,574 A | 10/1998 | Yamazaki et al. | 438/150 |
| 5,831,693 A | 11/1998 | McCartney, Jr. et al. | 349/42 |
| 6,559,488 B1 | 5/2003 | Thomas et al. | 257/257 |
| 7,423,639 B2 * | 9/2008 | Min | 345/207 |
| 7,462,863 B2 * | 12/2008 | Izumi | 257/59 |

(Continued)

FOREIGN PATENT DOCUMENTS

EP   1 154 383   11/2001

(Continued)

*Primary Examiner* — Hoan C Nguyen
(74) *Attorney, Agent, or Firm* — Morgan, Lewis & Bockius LLP

(57) ABSTRACT

A liquid crystal display device comprises a liquid crystal panel including first and second substrates bonded to each other with a liquid crystal layer positioned therebetween, and the photosensor, formed on the second substrate, for sensing an external light from the surroundings, wherein the photosensor includes a semiconductor layer formed on the second substrate and provided with $n^+$-type ion implantation region, ion non-implantation region and lightly doped region; an insulation film, formed on the second substrate, for covering the semiconductor layer; a passivation film, formed on the second substrate, for covering the insulation film; a first contact hole passing through the insulation film and the passivation film, to expose source and drain regions of the semiconductor layer; source and drain electrodes connected with the source and drain regions of the semiconductor layer through the first contact hole; an ion implanting prevention film formed on the insulation film and overlapped with the ion non-implantation region; and a second contact hole passing through the passivation film and the ion implanting prevention film above the ion non-implantation region, so as to provide the external light to the ion non-implantation region.

12 Claims, 18 Drawing Sheets

U.S. PATENT DOCUMENTS

| | | | |
|---|---|---|---|
| 7,576,361 B2 * | 8/2009 | Agranov et al. | 257/66 |
| 2005/0045881 A1 | 3/2005 | Nakamura et al. | 257/59 |
| 2005/0082968 A1 | 4/2005 | Choi et al. | 313/506 |
| 2006/0082568 A1 | 4/2006 | Yamazaki et al. | 345/207 |
| 2007/0013823 A1 | 1/2007 | Jung et al. | 349/42 |
| 2007/0200971 A1 | 8/2007 | Koide et al. | 349/61 |
| 2007/0215969 A1 | 9/2007 | Koide et al. | 257/431 |

FOREIGN PATENT DOCUMENTS

| | | |
|---|---|---|
| EP | 1 617 192 | 1/2006 |
| JP | 02-215168 | 8/1990 |
| JP | 2005-072126 | 3/2005 |
| WO | WO 2006/073774 | 7/2006 |
| WO | WO-2006/118028 | 11/2006 |

* cited by examiner

LIQUID CRYSTAL DISPLAY DEVICE WITH PHOTOSENSOR AND METHOD OF FABRICATING THE SAME

The present patent application is a divisional patent application derived from the patent application Ser. No. 12/003,043 filed on Dec. 19, 2007 now U.S. Pat. No. 7,787,065, a part of which is incorporated into the present application.

BACKGROUND OF THE INVENTION

1. Field of the Invention

The present invention relates to a liquid crystal display device, and more particularly, to a liquid crystal display device including a photosensor with improved sensing efficiency, and a method of fabricating the same.

2. Discussion of the Related Art

According as various mobile electronic devices, for example, mobile phone, PDA and notebook computer are developed recently, there are increasing demand for flat panel display devices with thin profile and light weight. Examples of flat panel display devices include liquid crystal display devices (LCD), field emission displays (FED), and plasma display panels (PDP). Among the flat panel display devices, the liquid crystal display device has the great attentions owing to the technology suitable for the mass production, the easy driving method and the realization of high resolution.

The liquid crystal display device corresponds to a transmitting-type display device, which controls the light transmittance through a liquid crystal layer by refractive anisotropy, thereby displaying desired images on a screen. For displaying the desired images in the liquid crystal display device, there is a requirement for a backlight unit whose light passes through the liquid crystal layer. Thus, the liquid crystal display device is comprised of the liquid crystal panel and the backlight unit provided at the rear of the liquid crystal panel.

The backlight unit emits the light of constant luminosity to the liquid crystal panel. That is, since the backlight unit emits the light of constant luminosity even in case of the relatively bright environments, it causes the increase of power consumption. Virtually, the backlight unit uses a large percentage of total power, in more detail, about 80% or more of the total power used for driving the liquid crystal display device. In order to fabricate the liquid crystal display device of the low power consumption type, there are various methods to lower the power consumption of backlight unit.

One of the various methods to lower the power consumption of backlight unit is to provide a liquid crystal display device including a photosensor which can sense the luminosity of external light from the surroundings.

As shown in FIG. 1, a liquid crystal display device 100 including a photosensor to sense luminosity of external light from the surroundings includes a liquid crystal panel 150 provided with an upper substrate 110, a lower substrate 120, and a liquid crystal layer 130 between the upper and lower substrates 110 and 120; and a backlight 200 provided at the lower substrate 120 and emitting light to the liquid crystal panel 150. The liquid crystal panel 150 is defined with a display region to display picture images; a non-display region on which picture images are not displayed; and a black matrix region, provided between the display region and the non-display region, for blocking the light.

The upper substrate 110 corresponds to a color filter substrate. At this time, R, G and B color filters 101 are formed in the pixel region of the upper substrate 110, and black matrix films 105 are formed in the black matrix region of the upper substrate 110. Although not shown in detail, the black matrix film 105 is provided in the boundary (not shown) of pixels, thereby preventing the light leakage. The color filter 101 is a resin film including dye or color. In addition, an overcoat layer (not shown) may be formed to planarize the surface of color filters 101. On the overcoat layer, there is a common electrode 103 to apply a voltage to the liquid crystal layer 130.

The lower substrate 120 is provided with a plurality of gate and data lines 125 and 127 crossing each other to define the pixels. Also, a switching device for switching each pixel is provided at each crossing of the gate and data lines 125 and 127. For example, the switching device is formed of a thin film transistor 121 including a gate electrode, a semiconductor layer, and source and drain electrodes. Then, a gate pad 125a is provided at one side of each gate line 125, and a data pad 127a is provided at one side of each data line 127, wherein the gate and data pads 125a and 127a apply signals to the respective gate and data lines 125 and 127. Each pixel is provided with a pixel electrode 123, wherein the pixel electrode 123 of the lower substrate 120 is facing with the common electrode 103 of the upper substrate 110. The common electrode 103 and the pixel electrode 123 are formed of transparent conductive materials which are suitable for transmitting the light to the backlight 200.

Also, a photosensor 140 is formed in the black matrix region of the lower substrate 120, to sense the luminosity of external light and control the brightness of backlight. To expose the photosensor 140 to the external environment, corresponding portion in the black matrix of the upper substrate 110 is partially removed.

As shown in FIG. 2, according as the corresponding portion of the black matrix 105 is removed from the black matrix region of the upper substrate 110, the photosensor 140 of the lower substrate 120 is exposed to the external. At this time, the photosensor 140 is formed simultaneously when forming the thin film transistor 121.

FIG. 3 is a cross section view illustrating a thin film transistor and a photosensor included in a liquid crystal display device according to the related art.

As shown in FIG. 3, a substrate 120 includes a thin film transistor region (I) having a channel of p-type ion implantation region; a thin film transistor region (II) having a channel of n-type ion implantation region; and a photosensor region (III).

Referring to FIG. 3, a p-type semiconductor layer 163, an n-type semiconductor layer 164, and an n-type and p-type semiconductor layer 165 are formed at fixed intervals on the substrate 120 including a buffer layer 162. Then, a gate insulation film 166 is formed on the p-type semiconductor layer 163, n-type semiconductor layer 164 and n-type and p-type semiconductor layer 165. Also, a gate electrode 168 is formed on the gate insulation film 166 above the p-type semiconductor layer 163 and the n-type semiconductor layer 164.

Also, an insulating interlayer 170 including a contact hole to expose the semiconductor layer is formed on the gate electrode 168. Then, source and drain electrodes 172 are formed on the insulating interlayer 170, wherein the source and drain electrodes 172 are respectively connected with the p-type semiconductor layer 163, n-type semiconductor layer 164 and n-type and p-type semiconductor layer 165 through the contact hole to expose the semiconductor layer.

The n-type semiconductor layer 164 is formed such that its region being in contact to the source and drain electrodes 172 is provided with an $n^+$-type ion implantation region 164a, its region being in contact to the gate insulation film 166 is provided with an ion non-implantation region 164b, and its region therebetween is provided with an $n^-$-type LDD layer 164c.

The p-type semiconductor layer 163 is formed without additional LDD layer and is formed such that its region being in contact to the source and drain electrodes 172 is provided with a p-type ion implantation region 163a and its region being in contact to the gate insulation film 166 is provided with an ion non-implantation region 163b.

The n-type and p-type semiconductor layer 165 is formed such that its region being in contact to the source and drain electrodes 172 is provided with $p^+$-type and $n^+$-type ion implantation regions 165a and 165b, and its region being in contact to the gate insulation film 166 is provided with an ion implantation region 165c.

On the ion-implantation process for forming the LDD layer, the $n^-$-type LDD layer 164c of the n-type semiconductor layer 164 is formed by using the gate electrode formed on the gate insulation film as an ion implantation mask, instead of using a mask of photoresist pattern. However, the gate electrode as well as the mask of photoresist pattern is not formed in the photosensor region (III) on the ion implantation process for forming the LDD layer. Thus, n-type ions are doped in the ion implantation region 165c between the $p^+$-type ion implantation region 165a and the $n^+$-type ion implantation region 165b.

In case of the photosensor region (III), if the ion implantation region 165c is formed between the $p^+$-type ion implantation region 165a and the $n^+$-type ion implantation region 165b, it is difficult to check the intensity of current in the photosensor region according to the intensity of external light.

In other words, if the external light becomes strong, it raises the intensity of current flowing through the source and drain electrodes, that is, $p^+$-type and $n^+$-type ion implantation regions 165a and 165b. Meanwhile, if the external light becomes weak, it lowers the intensity of current flowing through the source and drain electrodes. Accordingly, it is possible to check the intensity of current in the photosensor region according to the intensity of external light.

However, the related art photosensor region cannot check the intensity of current according to the intensity of external light since the $n^-$-type ion implantation region 165c formed between the $p^+$-type ion implantation region 165a and the $n^+$-type ion implantation region 165b affects the intensity of current flowing through the $p^+$-type and $n^+$-type ion implantation regions, so that the sensing efficiency of photosensor region deteriorates. That is, as shown in FIG. 4, the related art photosensor region has the non-linear property of drain current according to drain-source voltage Vds, whereby it is difficult to check the difference of current according to the intensity of external light, precisely.

SUMMARY OF THE INVENTION

Accordingly, the present invention is directed to a liquid crystal display device with a photosensor and a method of fabricating the same that substantially obviates one or more problems due to limitations and disadvantages of the related art.

An object of the present invention is to provide a liquid crystal display device including a photosensor with improved sensing efficiency, and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a liquid crystal display device with a photosensor comprises a liquid crystal panel including first and second substrates bonded to each other with a liquid crystal layer positioned therebetween, and the photosensor, formed on the second substrate, for sensing an external light from the surroundings, wherein the photosensor includes a semiconductor layer formed on the second substrate and provided with $n^+$-type ion implantation region, ion non-implantation region and lightly doped region; an insulation film, formed on the second substrate, for covering the semiconductor layer; a passivation film, formed on the second substrate, for covering the insulation film; a first contact hole passing through the insulation film and the passivation film, to expose source and drain regions of the semiconductor layer; source and drain electrodes connected with the source and drain regions of the semiconductor layer through the first contact hole; an ion implanting prevention film formed on the insulation film and overlapped with the ion non-implantation region; and a second contact hole passing through the passivation film and the ion implanting prevention film above the ion non-implantation region, so as to provide the external light to the ion non-implantation region.

In another aspect, a liquid crystal display device with a photosensor comprises a liquid crystal panel including first and second substrates bonded to each other with a liquid crystal layer positioned therebetween, and the photosensor, formed on the second substrate, for sensing an external light, wherein the photosensor includes a semiconductor layer formed on the second substrate and provided with $n^+$-type ion implantation region, ion non-implantation region and lightly doped region; an insulation film, formed on the second substrate, for covering the semiconductor layer; first and second auxiliary patterns formed on the insulation film adjacent to the semiconductor layer; a passivation film, formed on the second substrate, for covering the first and second auxiliary patterns and the insulation film; a first contact hole passing through the insulation film and the passivation film, to expose source and drain regions of the semiconductor layer; source and drain electrodes connected with the source and drain regions of the semiconductor layer through the first contact hole, and overlapped with the first and second auxiliary patterns; first and second auxiliary capacitors formed in the portions respectively overlapped between the source and drain electrodes and the first and second auxiliary patterns; an ion implanting prevention film formed on the insulation film and overlapped with the ion non-implantation region; and a second contact hole passing through the passivation film and the source and drain electrodes above the ion non-implantation region and formed by removing some or entire portions of the ion implanting prevention film, so as to provide the external light to the ion non-implantation region.

At this time, the central portion of the ion implanting prevention film is removed on the process of forming the second contact hole.

Also, the ion implanting prevention film is removed partially such that the ion implanting prevention film remains only at one lower edge of the second contact hole corresponding to the $n^+$-type ion implantation region when forming the second contact hole.

Also, the ion implanting prevention film and the source and drain electrodes are formed of the same material.

In another aspect, a method of fabricating a liquid crystal display device with a photosensor comprises preparing a first substrate including a color filter layer; preparing a second substrate including thin film transistor and photosensor regions; and forming a liquid crystal layer between the first and second substrates, wherein preparing the second substrate includes forming a buffer layer on the second substrate; forming semiconductor layers on the buffer layer of the thin film transistor and photosensor regions; forming an insulation film on the second substrate to cover the semiconductor layer; forming a gate electrode, overlapped with the semiconductor layers, on the insulation film of the thin film transistor region, and forming an ion implanting prevention film on the insulation film of the photosensor region; forming at least one of $n^+$-type and p-type ion implantation regions in the semiconductor layer of the thin film transistor region, and forming at least one of $n^+$-type and p-type ion implantation regions, an ion non-implantation region and a lightly doped region in the semiconductor layer of the photosensor region by using the gate electrode and the ion implanting prevention film, at the same time; forming a passivation film on an entire surface of the second substrate; forming a first contact hole exposing source and drain regions of the semiconductor layer in the thin film transistor region and source and drain regions of the semiconductor layer in the photosensor region, and forming a second contact hole passing through the passivation film above the ion non-implantation region of the photosensor region by exposing the ion implanting prevention film or removing some or entire portions of the ion implanting prevention film; and forming a metal film on the second substrate including the first and second contact holes, and patterning source and drain electrodes connected with the semiconductor layer of the thin film transistor through the first contact hole, and source and drain electrodes connected with the semiconductor layer of the photosensor region through the first contact hole, at the same time.

In addition, the method includes forming first and second auxiliary patterns formed on the insulation film adjacent to the semiconductor layer of the photosensor region and overlapped with the source and drain electrodes.

At this time, the ion implanting prevention film is completely removed on the process of forming the second contact hole.

Also, the ion implanting prevention film is exposed on the process of forming the second contact hole, and is completely removed on the process of patterning the source and drain electrodes.

Also, the central portion of the ion implanting prevention film is removed on the process of forming the second contact hole.

Also, the ion implanting prevention film is removed partially such that the ion implanting prevention film remains only at one lower edge of the second contact hole corresponding to the $n^+$-type ion implantation region when forming the second contact hole.

Also, the ion implanting prevention film and the source and drain electrodes are formed of the same material.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a liquid crystal display device including a photosensor according to the present invention will be described with reference to the accompanying drawings.

Figure 1:
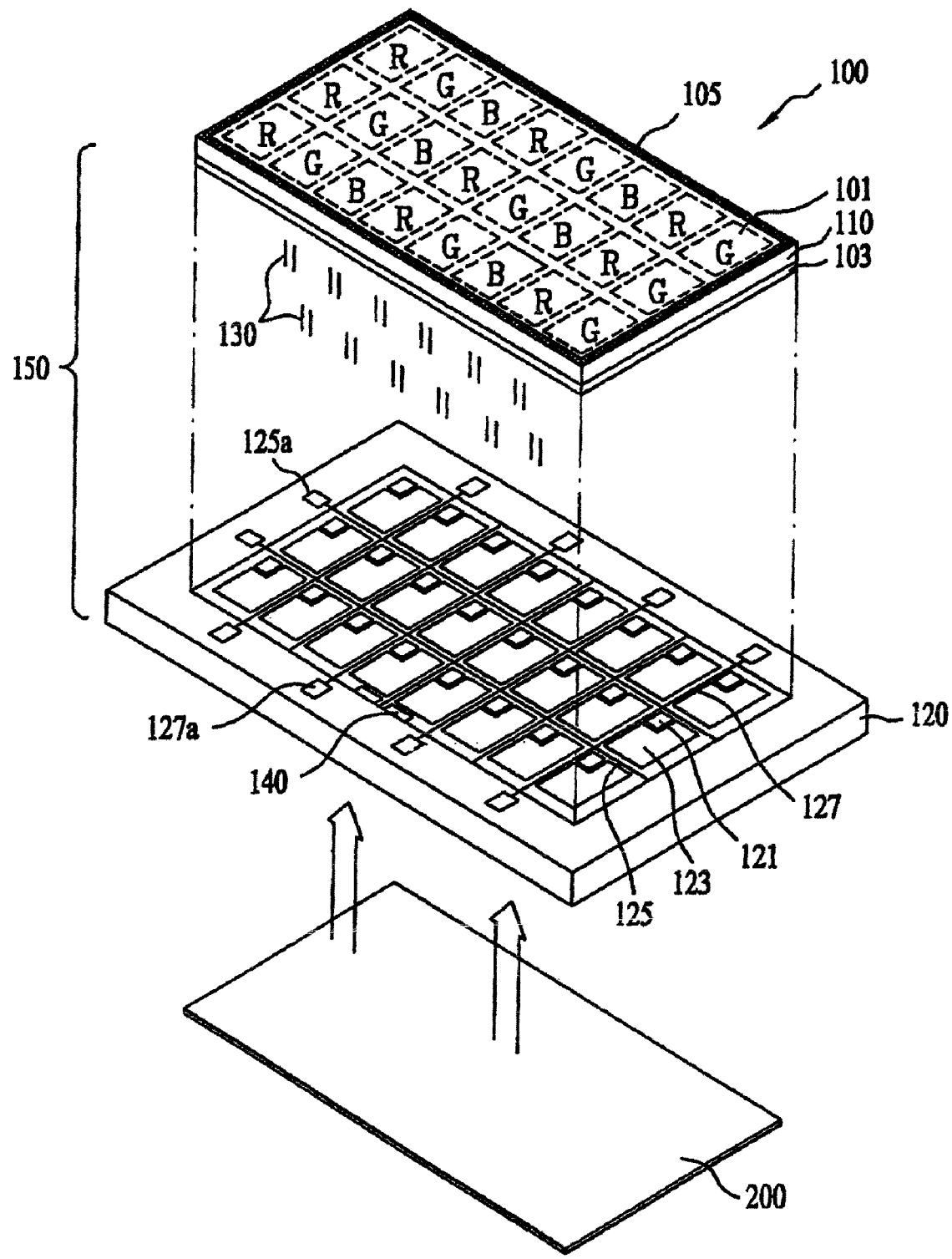
FIG. 1 is an exploded perspective view illustrating a liquid crystal display device with a photosensor according to the related art.
Figure 2:
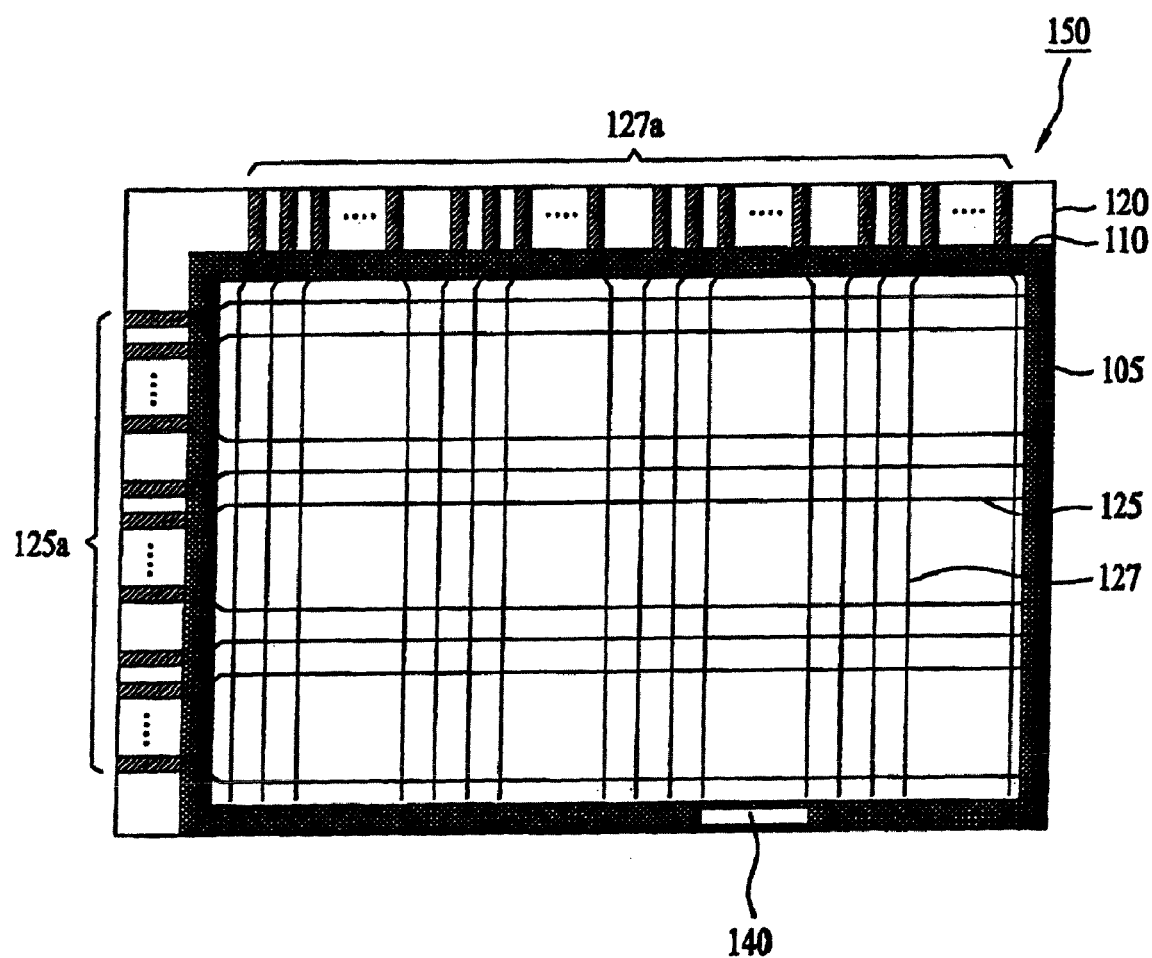
FIG. 2 is a plane view illustrating a liquid crystal panel of FIG. 1.
Figure 3:
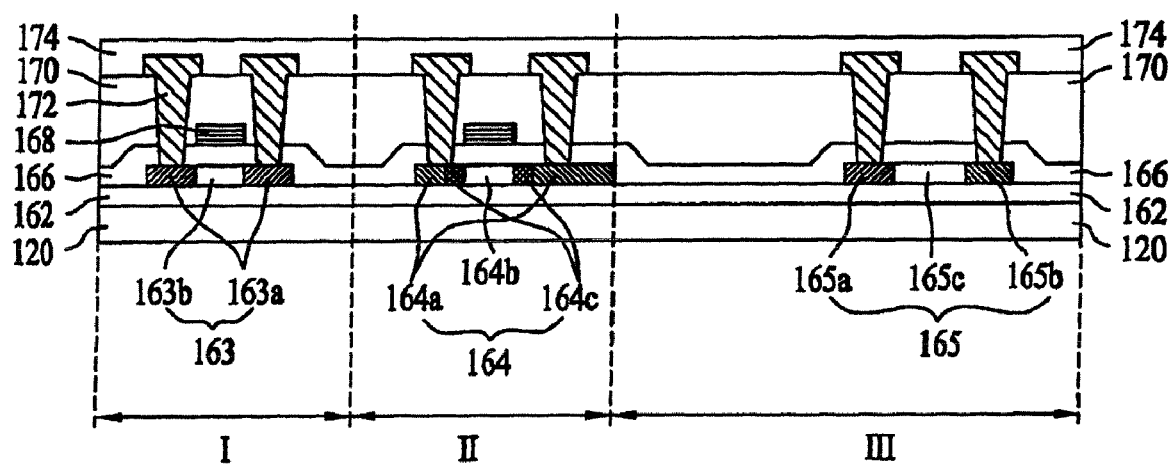
FIG. 3 is a cross section view illustrating a photosensor and a thin film transistor included in a liquid crystal panel according to the related art.
Figure 4:
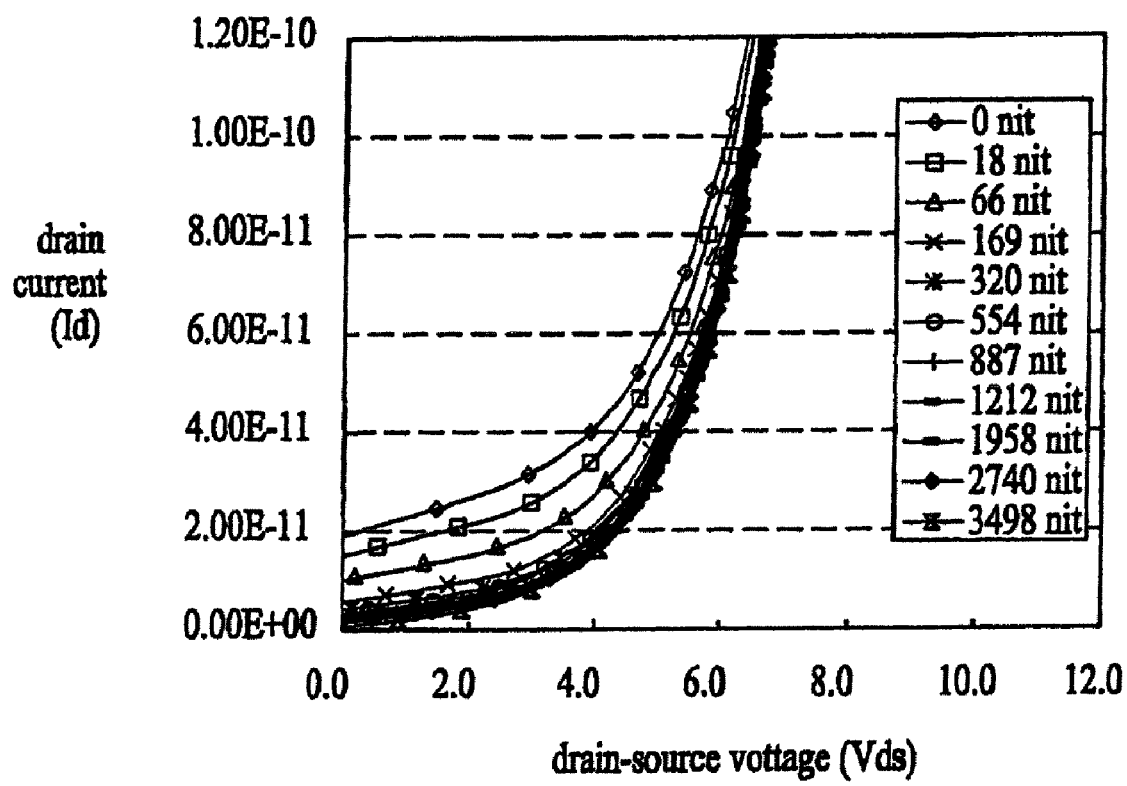
FIG. 4 is a graph illustrating current-voltage properties in a photosensor according to the related art.
Figure 5:
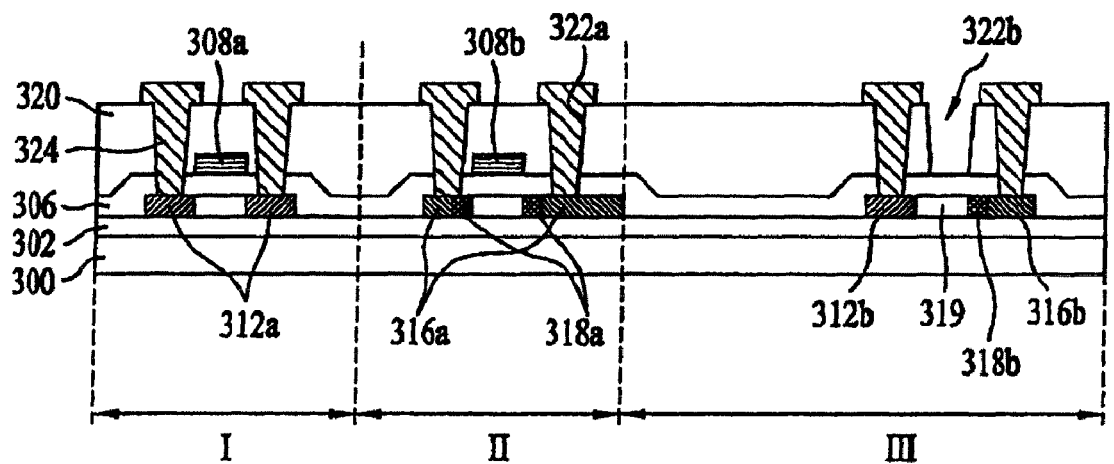
FIG. 5 is a cross section view illustrating a photosensor region and a thin film transistor region in a liquid crystal display device with a photosensor according to the first embodiment of the present invention.

FIG. 5 is a cross section view illustrating a photosensor region and a thin film transistor region in a liquid crystal display device including a photosensor according to the first embodiment of the present invention.

As shown in FIG. 5, a substrate 300 is defined with a first thin film transistor region (I) having a channel by a p-type ion implantation region; a second thin film transistor region (II) having a channel by an n-type ion implantation region; and a photosensor region (III).

The first thin film transistor region (I) includes a p-type semiconductor layer provided with two p-type ion implantation regions 312a on a buffer layer 302, and an ion non-implantation region formed between the two p-type ion implantation regions 312a; a gate insulation film 306 formed on the substrate 300 including the p-type semiconductor layer; a gate electrode 308a formed on the gate insulation film 306 above the ion non-implantation region; a passivation film 320 on an entire surface of the substrate 300 including the gate electrode 308a; and source and drain electrodes 324 connected to the p-type ion implantation region 312a through a first contact hole 322a.

FIG. 5 discloses that the first thin film transistor region (I) is provided with only p-type ion implantation region. However, there may be an n-type ion implantation region in the first thin film transistor region (I).

The second thin film transistor region (II) includes an n-type semiconductor layer provided with two n-type ion implantation regions 316a on the buffer layer 302, an ion non-implantation region formed between the two n-type ion implantation regions 316a, and an LDD region 318a formed between the n-type ion implantation region 316a and the ion non-implantation region; the gate insulation film 306 formed on the substrate 300 including the n-type semiconductor layer; a gate electrode 308b formed on the gate insulation film 306 above the ion non-implantation region; the passivation film 320 on the entire surface of the substrate 300 including the gate electrode 308b; and the source and drain electrodes 324 connected with the n-type ion implantation region 316a through the first contact hole 322a.

FIG. 5 discloses that the second thin film transistor region (II) is provided with only n-type ion implantation region. However, there may be a p-type ion implantation region in the second thin film transistor region (II).

The photosensor region (III) includes a semiconductor layer provided with p-type and n-type ion implantation regions 312b and 316b on the buffer layer 302, an ion non-implantation region 319 formed between the p-type and n-type ion implantation regions 312b and 316b, and an LDD region 318b formed between the n-type ion implantation region 316b and the ion non-implantation region 319; the gate insulation film 306 formed on the substrate 300 including the semiconductor layer; the passivation film 320 formed on the gate insulation film 306; a second contact hole 322b formed by removing the passivation film 320 above the ion non-implantation region 319; and the source and drain electrodes 324 connected to the p-type and n-type ion implantation regions 312b and 316b through the second contact hole 322b.

FIG. 5 discloses that the photosensor region (III) is provided with the n-type and p-type regions having the different types. However, the photosensor region (III) may be provided with same type ion implantation regions.

According as the ion non-implantation region 319 is formed in the photosensor region (III), it is possible to check an intensity of current in the photosensor according to an intensity of external light from the surroundings.

In the same manner as the related art, the photosensor region (III) may be formed in a region overlapped with a black matrix. Furthermore, the photosensor region (III) may be formed in a pixel of display area in a liquid crystal panel, or in a non-display area adjacent to the display area. In this case, it is preferable to provide a light-shielding layer (not shown) below the photosensor region, to thereby prevent light emitted from a backlight unit from being transmitted to the photosensor.

FIGS. 6A to 6F are cross section views illustrating a method of fabricating a liquid crystal display device with a photosensor according to the first embodiment of the present invention.

Referring to FIGS. 6A to 6F, a method of fabricating a liquid crystal display device with a photosensor according to the first embodiment of the present invention will be explained as follows.

Figure 6A:
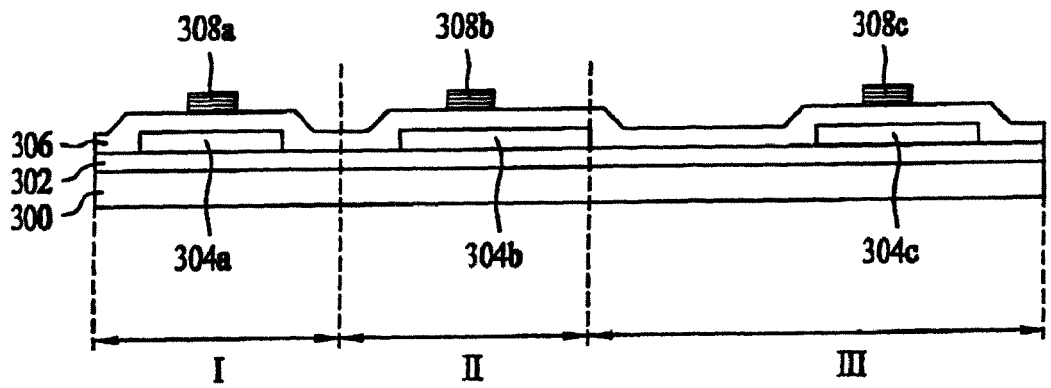
FIGS. 6A to 6F are cross section views illustrating a method of fabricating a liquid crystal display device with a photosensor according to the first embodiment of the present invention.

First, as shown in FIG. 6A, the buffer layer 302 is formed on the substrate 300. The buffer layer 302 is generally formed of an inorganic insulation film, for example, silicon nitride $SiN_x$ or silicon oxide $SiO_x$.

Then, the semiconductor layers 304a, 304b and 304c are respectively formed in the first thin film transistor region (I), the second thin film transistor region (II), and the photosensor region (III) of the buffer layer 302.

In more detail, an amorphous silicon layer is deposited on the entire surface of the substrate 300 including the buffer layer 302 by PECVD or sputtering. Subsequently, a dehydrogenation process, that is, a heating process of about 400° C. is carried out to prevent efficiency in a following crystallization process from being lowered due to hydrogen mixed in the amorphous silicon layer. Through this dehydrogenation process, the hydrogen is removed from the amorphous silicon layer. The amorphous silicon layer from which hydrogen is removed is crystallized by laser, thereby forming a polysilicon film. Thereafter, a photoresist pattern is formed on the polysilicon film, and is then patterned by photolithography, thereby forming the semiconductor layer. Then, the polysilicon film is etched by using the photoresist pattern as an etching mask, whereby the semiconductor layers 304a, 304b and 304c are respectively formed in the first thin film transistor region (I), the second thin film transistor region (II), and the photosensor region (III).

Subsequently, the gate insulation film 306 is formed on the substrate 300 including the semiconductor layers 304a, 304b and 304c. The gate insulation film 306 is formed of an inorganic insulation material such as $SiO_2$.

Then, the gate electrodes 308a and 308b and an ion implanting prevention film 308c are respectively formed on the gate insulation film 306 above the respective central portions of the semiconductor layers 304a, 304b and 304c.

To form the gate electrodes 308a and 308b and the ion implanting prevention film 308c, any one of aluminum Al, copper Cu, molybdenum Mo, titanium Ti, chrome Cr, tantalum Ta, aluminum alloy Al alloy, copper alloy Cu alloy, molybdenum alloy Mo alloy, tungsten-based metal W is formed on the gate insulation film 306, and is then patterned by photolithography.

Figure 6B:
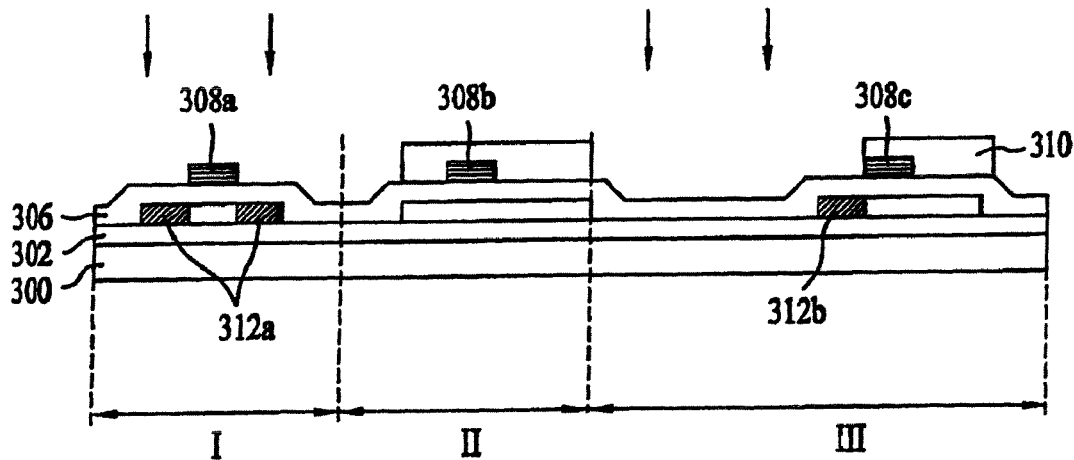

As shown in FIG. 6B, a first photoresist pattern 310 is formed by photolithography, to expose some portions of the first thin film transistor region (I) and the photosensor region (II). According as p-type ions are implanted using the first photoresist pattern 310 as an ion implantation mask, the p-type ion implantation regions 312a and 312b are respectively formed in the semiconductor layer 304a of the first thin film transistor region and the semiconductor layer 304c of the photosensor region.

The p-type ion implantation region 312a of the first thin film transistor region (I) becomes the source and drain regions of the p-type thin film transistor. Also, the p-type ion implantation region 312b of the photosensor region becomes the source or drain region. Then, the first photoresist pattern 310 to define the p-type ion implantation region is removed by stripping.

Figure 6C:
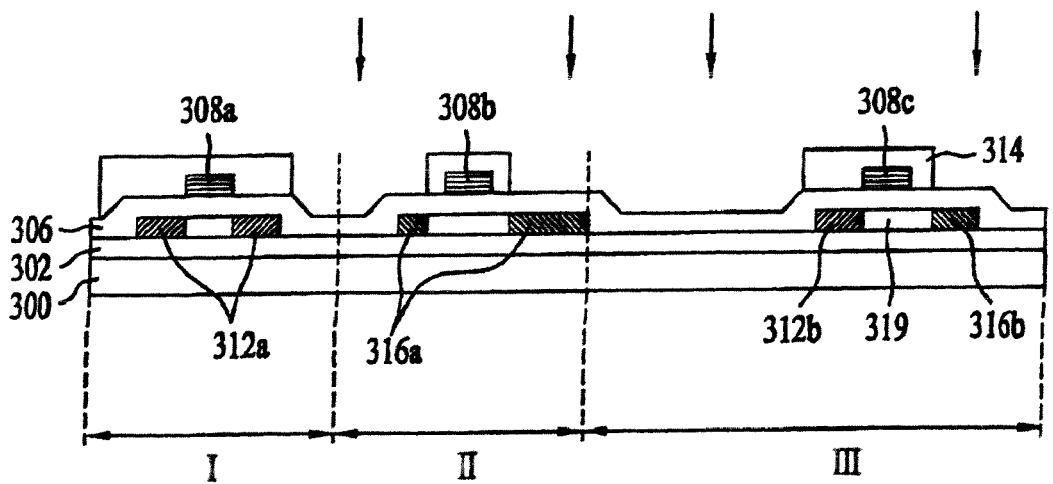

As shown in FIG. 6C, a second photoresist pattern 314 is formed on the substrate 300 including the p-type ion implantation regions 312a and 312b, and is then patterned by photolithography, to expose some portions of the second thin film transistor region (II) and the photosensor region (III). Then, highly doped n+-type ions are implanted in state of using the second photoresist pattern 314 as an ion implantation mask, whereby the n+-type ion implantation regions 316a and 316b are respectively formed in the semiconductor layer 304b of the second thin film transistor region (II) and the semiconductor layer 304c of the photosensor region (III).

The n+-type ion implantation region 316a of the second thin film transistor region (II) becomes the source and drain regions of the n-type thin film transistor. Also, the n+-type ion implantation region 316b of the photosensor region (III) becomes the source or drain region. Next, the second photoresist pattern 314 is removed by stripping.

Figure 6D:
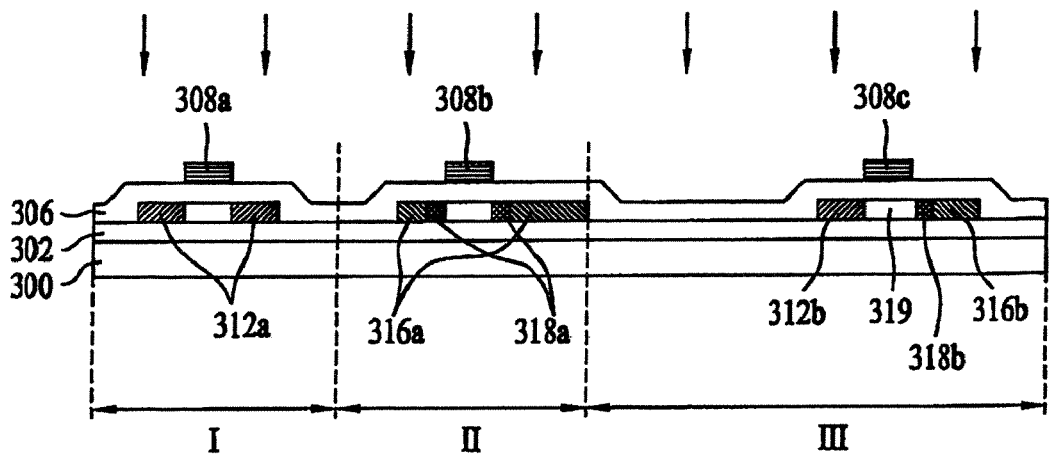

As shown in FIG. 6D, lightly doped n−-type ions are implanted into the entire surface of the substrate 300, thereby forming the respective LDD layers 318a and 318b in the semiconductor layer 304b of the second thin film transistor region (II) and the semiconductor layer 304c of the photosensor region (III).

When forming the LDD layers 318a and 318b, the gate electrode 308b and the ion implanting prevention film 308c are used as the ion implantation mask. Especially, the lightly doped n−-type ions are more usually used than the highly doped n+-type ions used when forming the n+-type ion implantation regions 316a and 316b.

In the meantime, the n−-type ions are lightly doped on the entire surface of the substrate 300. Virtually, the doping layer is formed only in the semiconductor layer into which the ions are not implanted. That is, the doping layer is not formed in the p+-type ion implantation regions 312a and 312b provided with p-type ions implanted thereinto, and the n+-type ion implantation regions 316a and 316b provided with n+-type ions implanted thereinto.

When implanting the ions to form the LDD layer 318b in the photosensor region (III), the ion non-implantation region 319 is formed in the semiconductor layer 304c due to the ion implanting prevention film 308c.

As the ion non-implantation region 319 is formed in the photosensor region (III), it is possible to improve the photosensing efficiency in the photosensor region (III) as compared with that of the related art. That is, the related art photosensor having the ion implantation region provides the indistinct difference between currents based on the intensity of light. Meanwhile, the photosensor having the ion non-implantation region 319 according to the present invention can provide the distinct difference between currents based on the intensity of light.

Figure 6E:
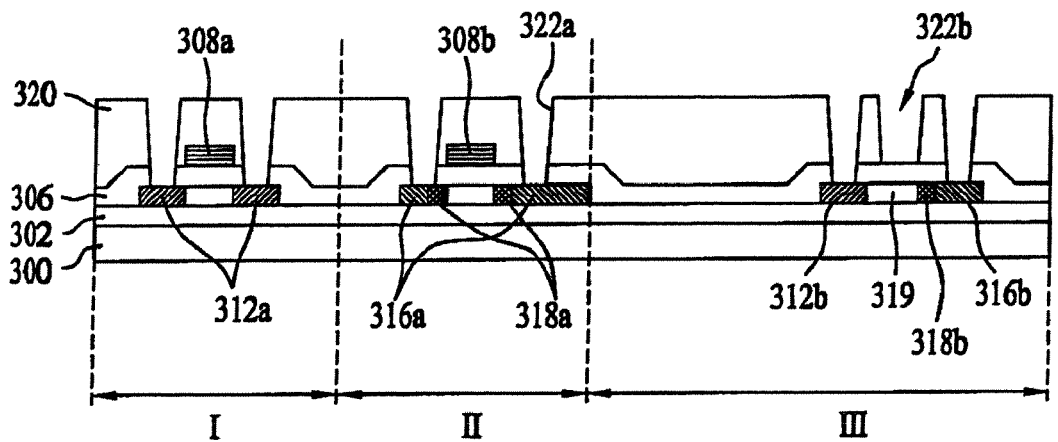

Thereon, the passivation film 320 is formed and is then patterned to form the first and second contact holes 322a and 322b at the same time, as shown in FIG. 6E. At this time, the first contact hole 322a exposes the semiconductor layer of the source and drain regions 312a and 316a in the respective first thin film transistor region (I) and the second thin film transistor region (II). Also, the second contact hole 322b exposes the semiconductor layer of the source and drain regions 312b and 316b in the photosensor region. The ion implanting prevention film 308c of the photosensor region (III) is removed by an etchant to remove the passivation film 320 and the gate material when forming the second contact hole 322b, together. At this time, the second contact hole 322b may be formed in the portion to electrically connect the gate electrode of circuit region (not shown) with the source and drain electrodes. However, since the contact hole (not shown) included in the circuit region is smaller than the second contact hole 322b included in the photosensor region (III) in size, the gate electrode (not shown) included in the circuit region is not removed when forming the second contact hole.

Figure 6F:
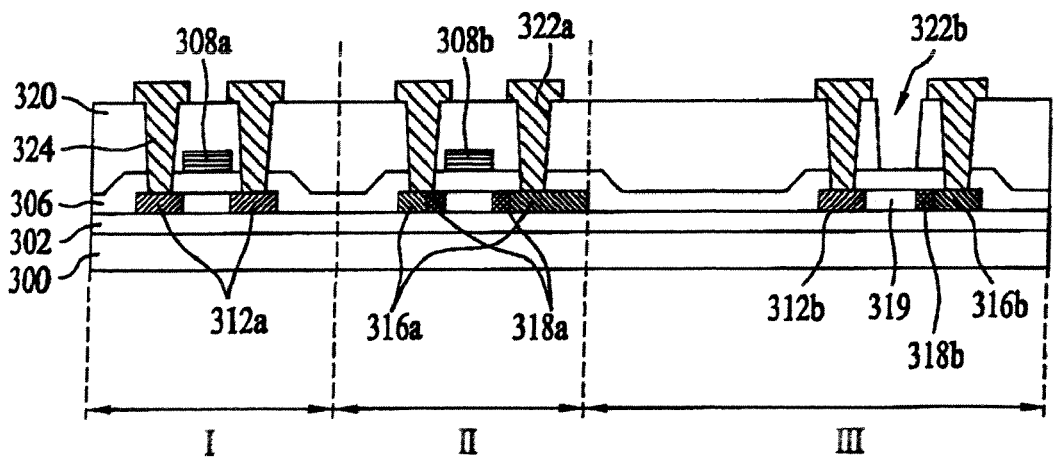

Referring to FIG. 6F, a metal film is deposited on the entire surface of the substrate 300 including the first and second contact holes 322a and 322b, and is then patterned to form the source and drain electrodes 324 being in contact with the source and drain regions 312a, 316a, 312b and 316b, thereby completing the process.

Figure 7:
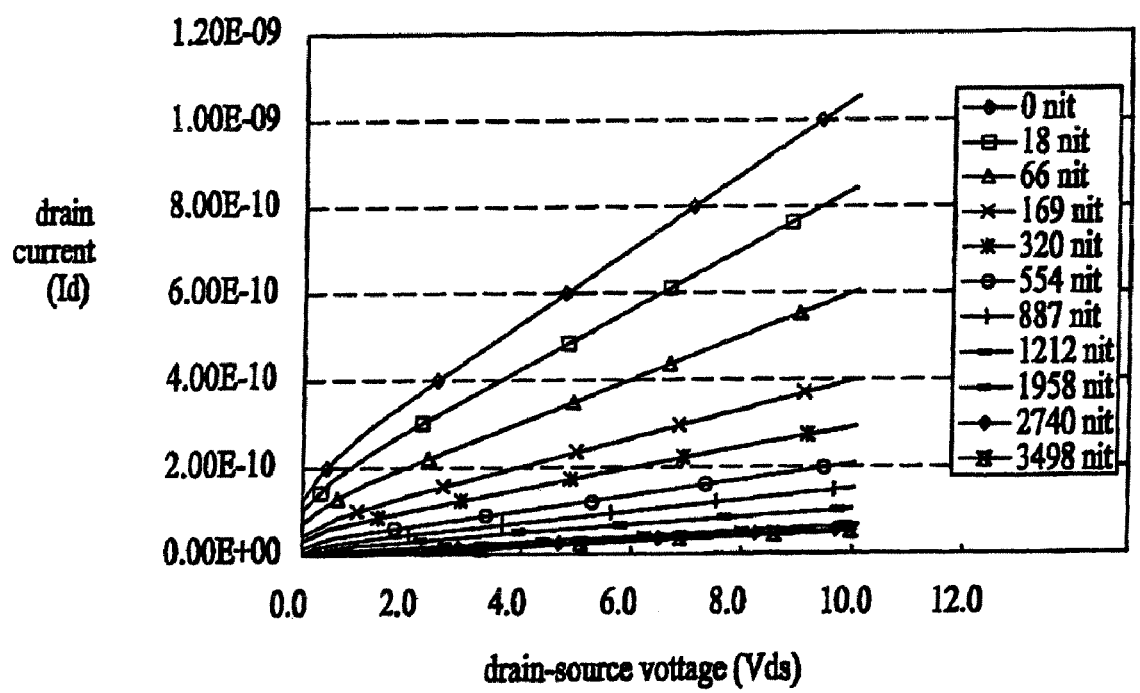
FIG. 7 is a graph illustrating current-voltage properties in a photosensor according to the present invention.

In the photosensor according to the first embodiment of the present invention, the intensity of current flowing through the p-type and n+-type ion implantation regions of the photosensor becomes strong with the increase of intensity of external light. Also, as the intensity of external light is lowered, the intensity of current flowing through the source and drain electrodes becomes weak, as shown in FIG. 7. As a result, the current intensity of photosensor shows the linear property according the intensity of external light, whereby the photosensing efficiency improves.

In the first embodiment of the present invention, the ion implanting prevention film 308c is removed on the process of forming the contact hole. The following discloses a method of fabricating a liquid crystal display device with a photosensor according to the second embodiment of the present invention where the ion implanting prevention film 308c is removed on the process of forming the source and drain electrodes.

Figure 8A:
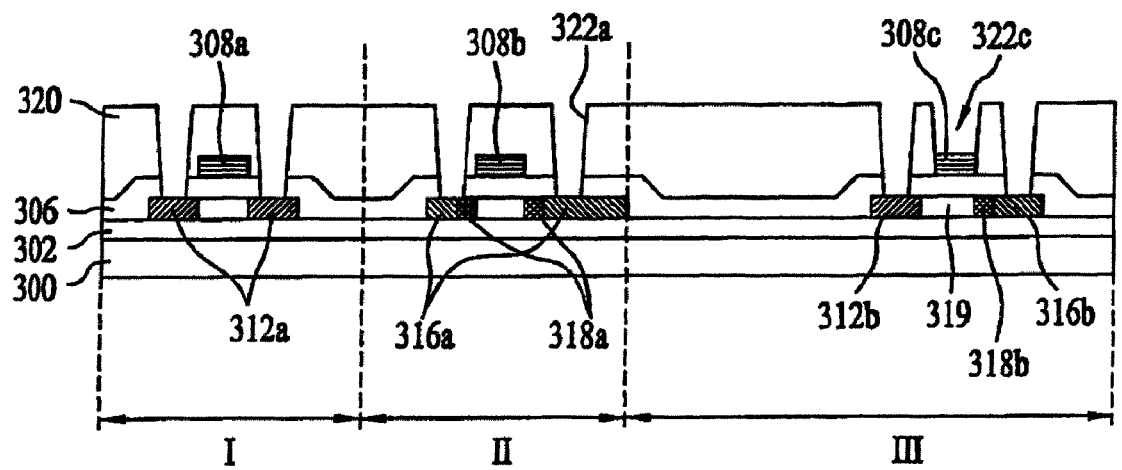
FIGS. 8A to 8C are cross section views illustrating a method of fabricating a liquid crystal display device with a photosensor according to the second embodiment of the present invention.
Figure 8B:
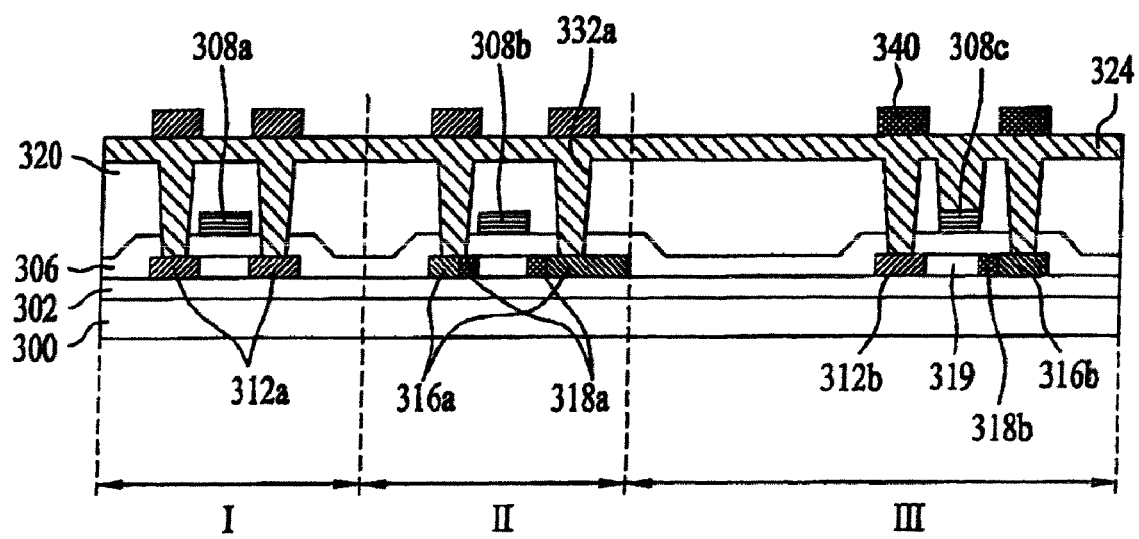
Figure 8C:
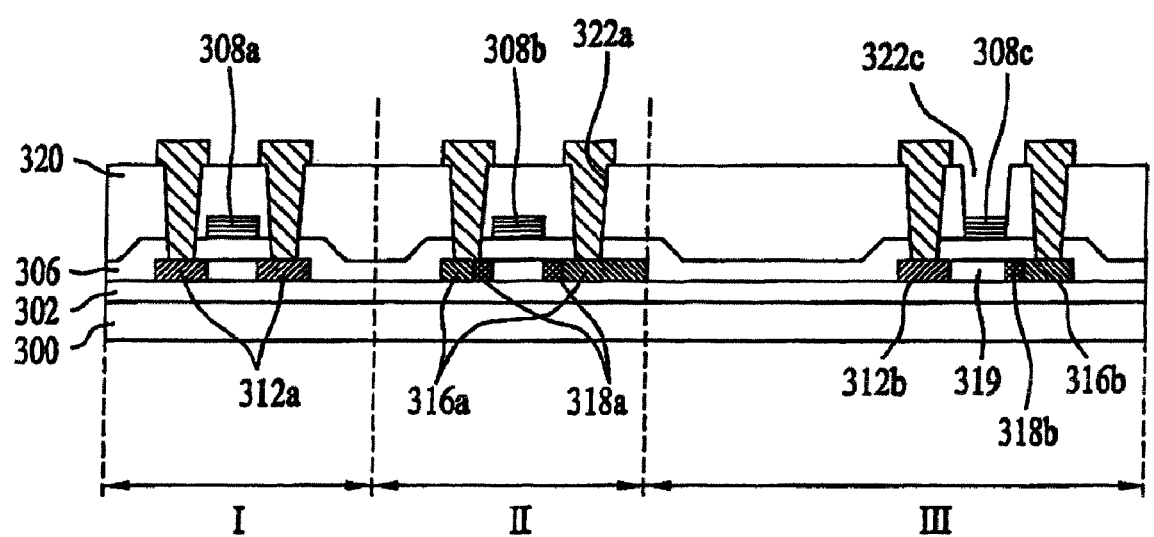

FIGS. 8A to 8C are cross section views illustrating a method of fabricating a liquid crystal display device with a photosensor according to the second embodiment of the present invention.

First, LDD layers 318a and 318b are formed through the steps explained in FIGS. 6A and 6D according to the first embodiment of the present invention.

Subsequently, as shown in FIG. 8A, a passivation film 320 is formed on an entire surface of a substrate 300 including the LDD layers 318a and 318b, and is then patterned, thereby forming first and second contact holes 322a and 322c at the same time. At this time, the first contact hole 322a exposes semiconductor layers of source and drain regions 312a and 316a in respective first and second thin film transistor regions (I) and (II). Also, the second contact hole 322c exposes an ion implanting prevention film 308c of a photosensor region (III).

As shown in FIG. 8B, a metal film 324 is formed on the entire surface of the substrate 300 including the first and second contact holes 322a and 322c. Then, a photoresist pattern 340 for source and drain electrode is formed on the metal film 324. At this time, the metal film is formed of the same material as a gate electrode, preferably.

The metal film 324 is patterned by using the photoresist pattern 340 for source and drain electrode as a mask, thereby forming source and drain electrodes 324 being in contact with the source and drain regions 312a, 316a, 312b and 316b in the respective regions (I), (II) and (III), as shown in FIG. 8C. At this time, the metal film 324 and the ion implanting prevention film 308c are patterned at the same time in the photosensor region (III), thereby forming the second contact hole 322c.

The photosensor according to the second embodiment of the present invention has the same efficiency as the photosensor according to the first embodiment of the present invention.

The first and second preferred embodiments of the present invention disclose that the ion implanting prevention film 308c is removed completely. The following discloses a method of fabricating a liquid crystal display device including a photosensor according to the third embodiment of the present invention where only the central portion of the ion implanting prevention film 308c is removed.

Figure 9A:
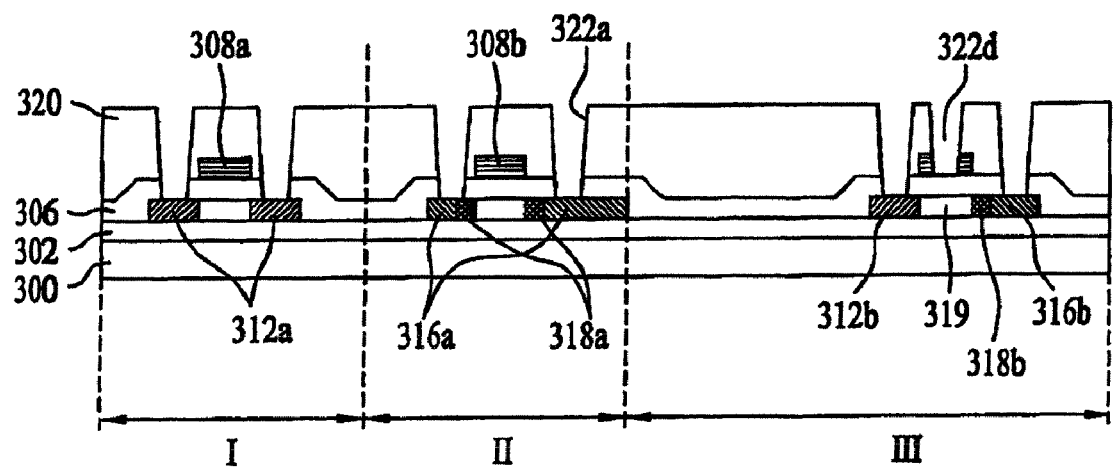
FIGS. 9A and 9B are cross section views illustrating a method of fabricating a liquid crystal display device with a photosensor according to the third embodiment of the present invention.
Figure 9B:
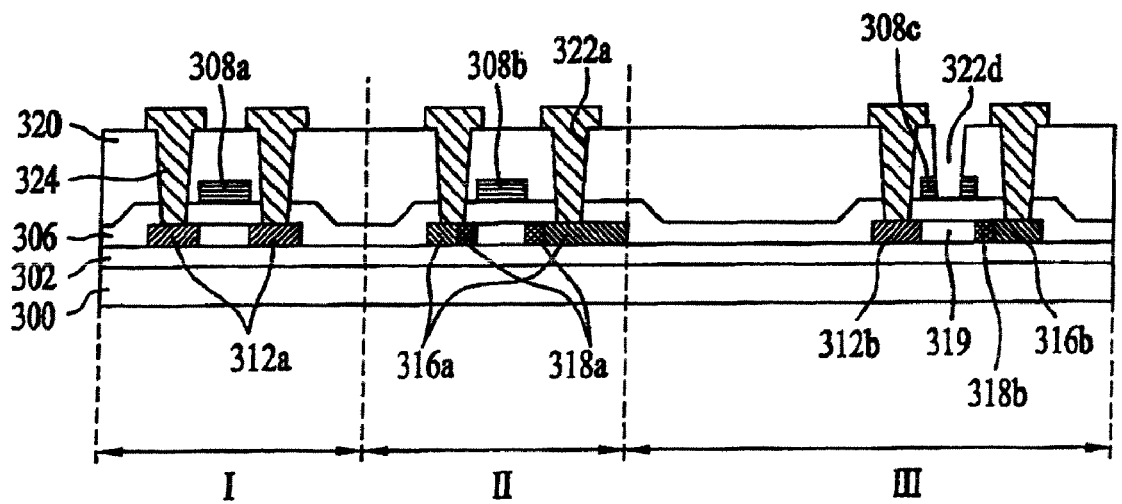

FIGS. 9A and 9B are cross section views illustrating a method of fabricating a liquid crystal display device with a photosensor according to the third embodiment of the present invention.

First, LDD layers 318a and 318b are formed through the steps of FIGS. 6A to 6D explaining the first embodiment of the present invention.

Subsequently, as shown in FIG. 9A, a passivation film 320 is formed on an entire surface of a substrate 300 including the LDD layers 318a and 318b, and is then patterned, thereby forming first and second contact holes 322a and 322d at the same time. At this time, the first contact hole 322a exposes semiconductor layers of source and drain regions 312a and 316a in respective first and second thin film transistor regions (I) and (II). Also, the second contact hole 322d is formed by removing only the central portion of ion implanting prevention film 308c in a photosensor region (III). At this time, the ion implanting prevention film 308c remains at the lower edge of the second contact hole 322d, to thereby prevent the semiconductor layer positioned below the second contact hole 322d from being damaged.

In other words, if completely removing the ion implanting prevention film as shown in the first and second embodiments of the present invention, the semiconductor layer positioned below the second contact hole 322 may be damaged according as a gate insulation film is etched on the process of forming the contact hole. However, in case of the photosensor according to the third embodiment of the present invention, the ion implanting prevention film 308c remains at both lower edges of the second contact hole 322d, whereby it is possible to prevent the semiconductor layer positioned below the second contact hole 322d from being damaged.

Then, a metal film is formed on the substrate 300 including the first and second contact holes 322a and 322d, and is then patterned, thereby forming source and drain electrodes 324 being in contact with source and drain regions 312a, 316a, 312b and 316b in the respective regions (I), (II) and (III), as shown in FIG. 9B, thereby completing the process.

The photosensor according to the third embodiment of the present invention has the same effect as the photosensor according to the first embodiment of the present invention.

Figure 10A:
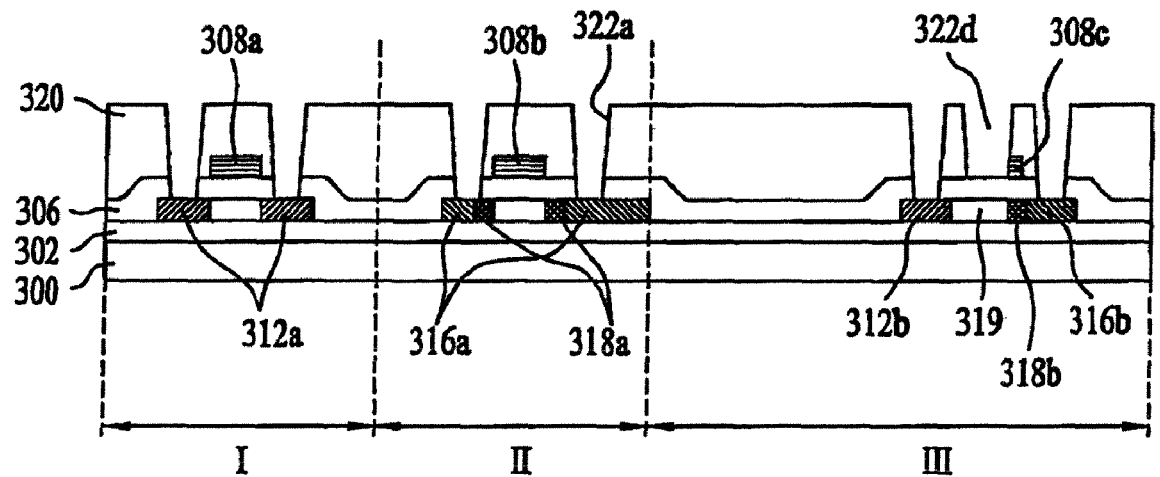
FIGS. 10A and 10B are cross section views illustrating a method of fabricating a liquid crystal display device with a photosensor according to the fourth embodiment of the present invention.
Figure 10B:
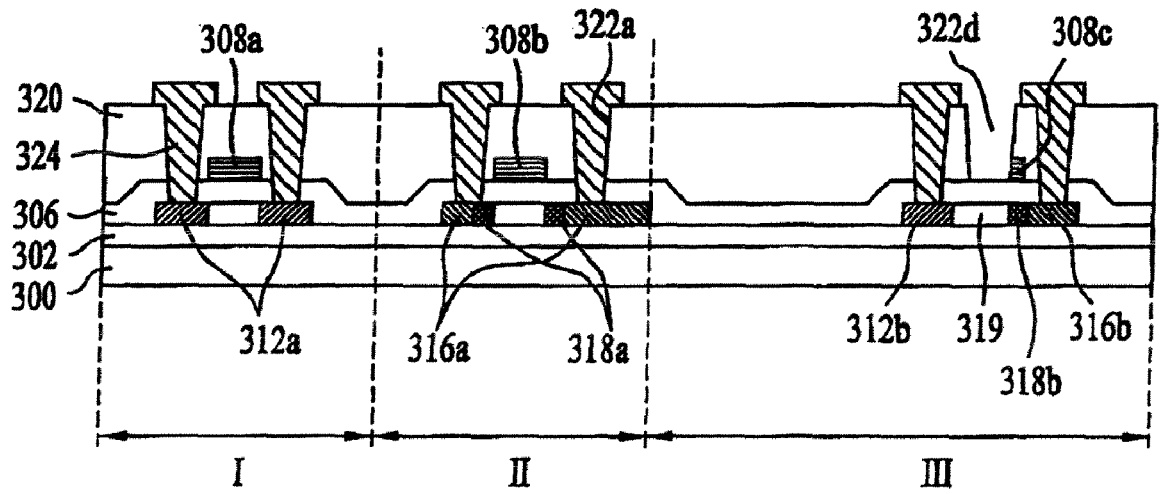

FIGS. 10A and 10B are cross section views illustrating a method of fabricating a liquid crystal display device with a photosensor according to the fourth embodiment of the present invention.

Except the process of patterning of ion implanting prevention film 308c, the fabrication process for the fourth embodiment of the present invention is identical to the fabrication process for the third embodiment of the present invention.

The third embodiment of the present invention discloses that only the central portion of the ion implanting prevention film 308c is removed when forming the second contact hole 322d. In case of the fourth embodiment of the present invention with reference to FIG. 10A, a passivation film 320 and an ion implanting prevention film 308c are patterned so as to make the ion implanting prevention film 308c remaining at one lower edge of a second contact hole 322d corresponding to an n⁺-type ion implantation region 316b in a photosensor region (III).

Then, a metal film is formed on the substrate 300 including the first and second contact holes 322a and 322d, and is then patterned, thereby forming source and drain electrodes 324 being in contact with source and drain regions 312a, 316a, 312b and 316b in the respective regions (I), (II) and (III), as shown in FIG. 10B, thereby completing the process.

The aforementioned preferred embodiment discloses the photosensor provided with both p-type and n-type ion implantation regions. However, it can be changed to the photosensor provided with only n-type ion implantation regions, or provided with only p-type ion implantation regions.

In case of the aforementioned embodiment of the present invention, only the p-type ion implantation region is formed in the first thin film transistor region. However, the n-type ion implantation region may be formed in the first thin film transistor region of the aforementioned embodiment of the present invention. Also, the second thin film transistor region is provided with only the n-type ion implantation region. However, the second thin film transistor region may be provided with the p-type ion implantation region.

Figure 11:
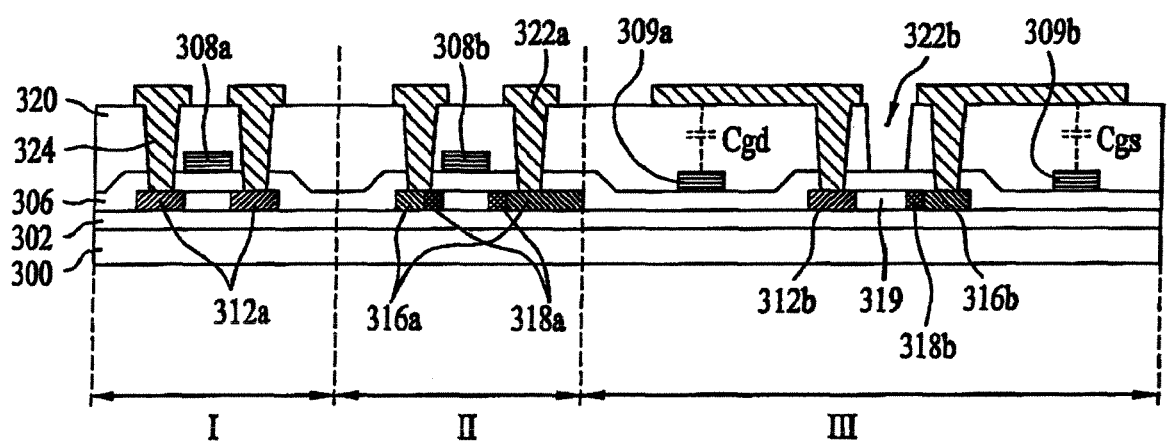
FIG. 11 is a cross section view illustrating photosensor and thin film transistor regions in a liquid crystal display device with a photosensor according to the fifth embodiment of the present invention.

FIG. 11 is a cross section view illustrating photosensor and thin film transistor regions in a liquid crystal display device with a photosensor according to the fifth embodiment of the present invention.

Except that the photosensor according to the fifth embodiment of the present invention has a floating gate structure, the photosensor according to the fifth embodiment of the present invention is identical in structure to the photosensor according to the first embodiment of the present invention.

In detail, the photosensor according to the fifth embodiment of the present invention is provided with first and second auxiliary patterns 309a and 309b which are formed on a gate insulation film 306 and are overlapped with source and drain electrodes 324 of photosensor region (III). At this time, the first and second auxiliary patterns 309a and 309b form first and second auxiliary capacitors Cgs and Cgd.

The first and second auxiliary patterns 309a and 309b are overlapped with the source and drain electrodes 324 in state of interposing a passivation film 320 therebetween, thereby forming the first and second auxiliary capacitors Cgs and Cgd. Thus, the first and second auxiliary patterns 309a and 309b prevent a voltage charged in a gate electrode from being changed by a parasitic capacitance between source and gate electrodes and a parasitic capacitance between drain and gate electrodes. At this time, the capacitance of first and second auxiliary capacitors Cgs and Cgd is larger than the parasitic capacitance.

The liquid crystal display device according to the fifth embodiment of the present invention is provided with the photosensor having the floating gate structure, and is also provided with the first and second auxiliary capacitors Cgs and Cgd to prevent the voltage charged in the gate electrode from being changed, thereby improving the sensing efficiency of photosensor.

Also, the liquid crystal display device including the photosensor according to the fifth embodiment of the present invention discloses that the ion non-implantation region 319 is formed in the semiconductor layer of the photosensor region (III), so that it is possible to improve the sensing efficiency of photosensor.

FIGS. 12A to 12F are cross section views illustrating a method of fabricating a liquid crystal display device with a photosensor according to the fifth embodiment of the present invention.

The method of fabricating the liquid crystal display device with the photosensor according to the fifth embodiment of the present invention will be explained with reference to FIGS. 12A to 12F.

Figure 12A:
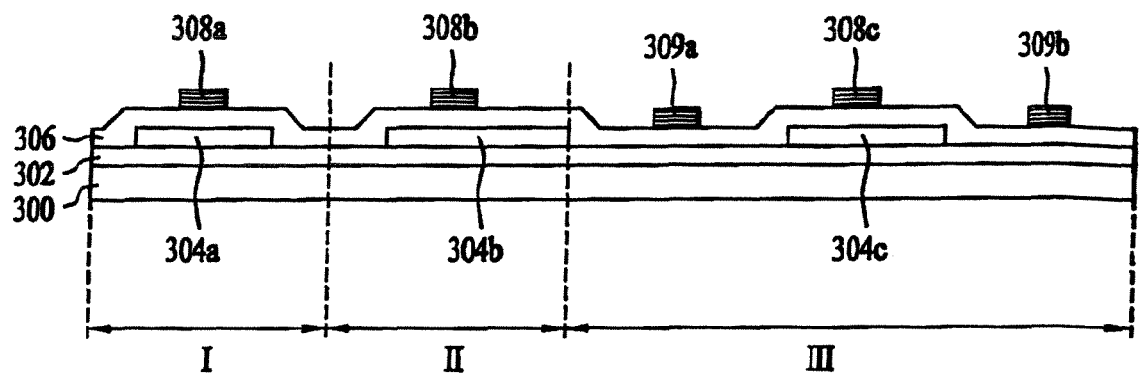
FIGS. 12A to 12F are cross section views illustrating a method of fabricating a liquid crystal display device with a photosensor according to the fifth embodiment of the present invention.
Figure 12B:
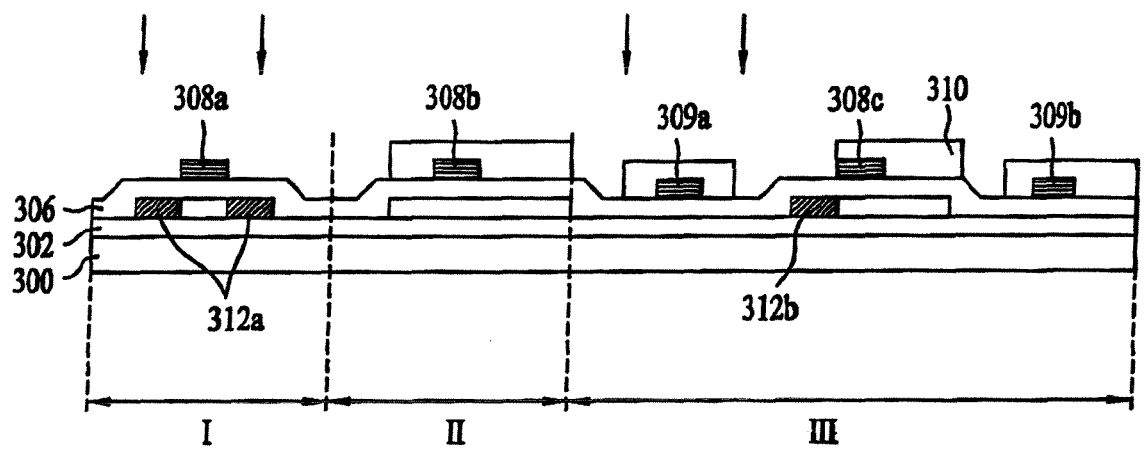
Figure 12C:
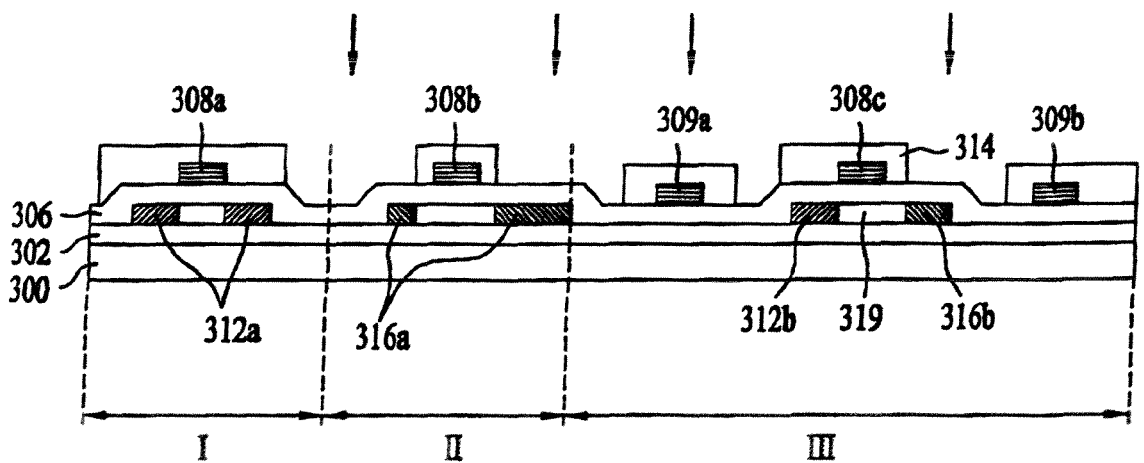
Figure 12D:
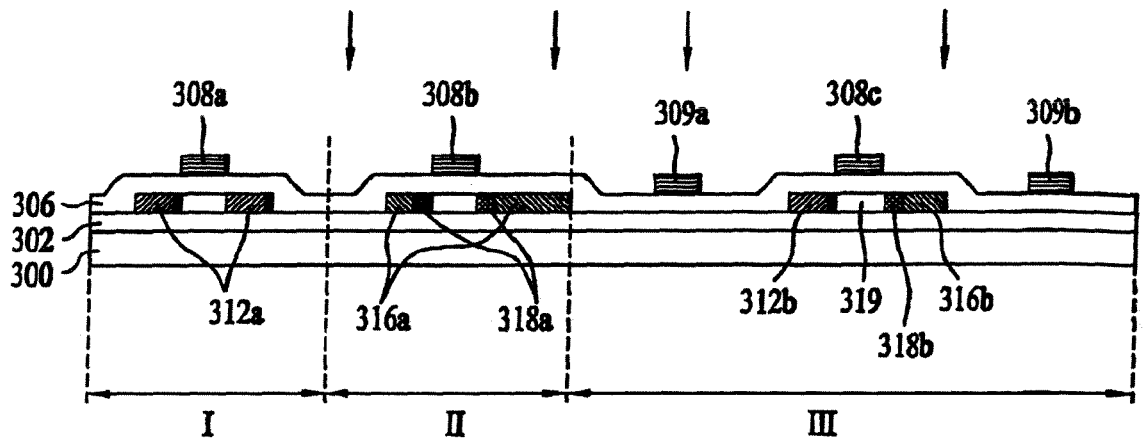
Figure 12E:
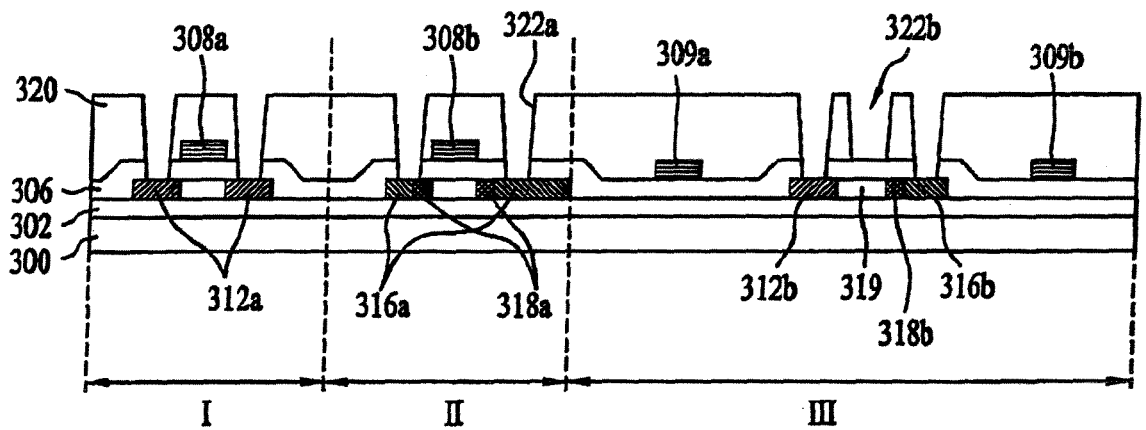

First, as shown in FIG. 12A, a buffer layer 302 is formed on the substrate 300. Generally, the buffer layer 302 is formed of an inorganic insulation film, for example, silicon nitride $SiN_x$ or silicon oxide $SiO_x$. Then, the semiconductor layers 304a, 304b and 304c are respectively formed in the first thin film transistor region (I), the second thin film transistor region (II) and the photosensor region (III) of the buffer layer 302.

Thereafter, a gate insulation film 306 is formed on the substrate 300 including the semiconductor layers 304a, 304b and 304c. The gate insulation film 306 is formed of an inorganic insulation material such as $SiO_2$.

Then, gate electrodes 308a and 308b and ion implanting prevention film 308c are respectively formed on the gate insulation film 306 above the central portions of the semiconductor layers 304a, 304b and 304c. At the same time, the first and second auxiliary patterns 309a and 309b are formed on the gate insulation film 306 adjacent to the semiconductor layer 304c of the photosensor region (III).

To form the gate electrodes 308a and 308b, the ion implanting prevention film 308c and the first and second auxiliary patterns 309a and 309b, any one of aluminum Al, copper Cu, molybdenum Mo, titanium Ti, chrome Cr, tantalum Ta, aluminum alloy Al alloy, copper alloy Cu alloy, molybdenum alloy Mo alloy, tungsten-based metal W is formed on the gate insulation film 306, and is then patterned by photolithography.

Referring to FIGS. 12B to 12F, p-type ion implantation regions 312a and 312b are respectively formed in the semiconductor layer 304a of the first thin film transistor region (I) and the semiconductor layer 304c of the photosensor region (III). Thereafter, n⁻-type ion implantation regions 316a and 316b are respectively formed in the semiconductor layer 304b of the second thin film transistor region (II) and the semiconductor layer 304c of the photosensor region (III). Then, the LDD layers 318a and 318b, first and second contact holes 322a and 322b and source and drain electrodes 324 are formed in sequence. The explanation for each process of FIGS. 12B to 12F is same as the explanation of each process of FIGS. 6B to 6F, whereby the detailed explanation for each process of FIGS. 12B to 12F will be substituted by the explanation of each process of FIGS. 6B to 6F.

Figure 12F:
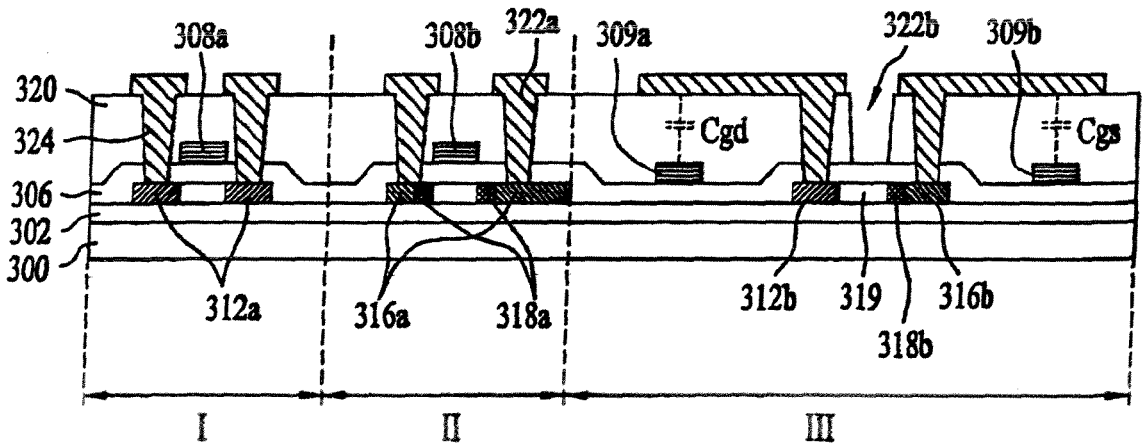

As shown in FIG. 12F, the source and drain electrodes 324 in the photosensor region (III) overlap with the first and second auxiliary patterns 309a and 309b.

The method of fabricating the liquid crystal display device including the photosensor according to the fifth embodiment of the present invention prevent the change of voltage charged in the gate electrode by using the first and second auxiliary capacitors Cgs and Cgd, and also improves the sensing efficiency of photosensor by forming the ion non-implantation region 319 in the semiconductor layer of the photosensor region (III) by using the ion implanting prevention film 308c.

Figure 13A:
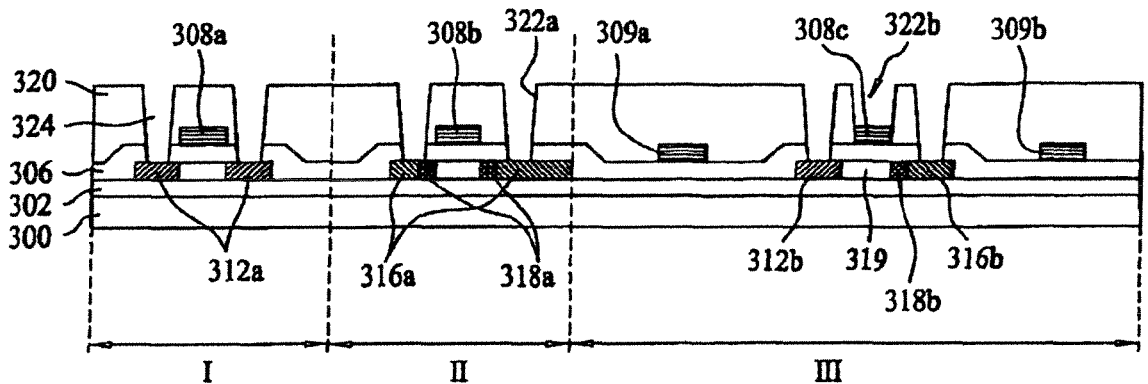
FIGS. 13A to 13C are cross section views illustrating a method of fabricating a liquid crystal display device with a photosensor according to the sixth embodiment of the present invention.
Figure 13B:
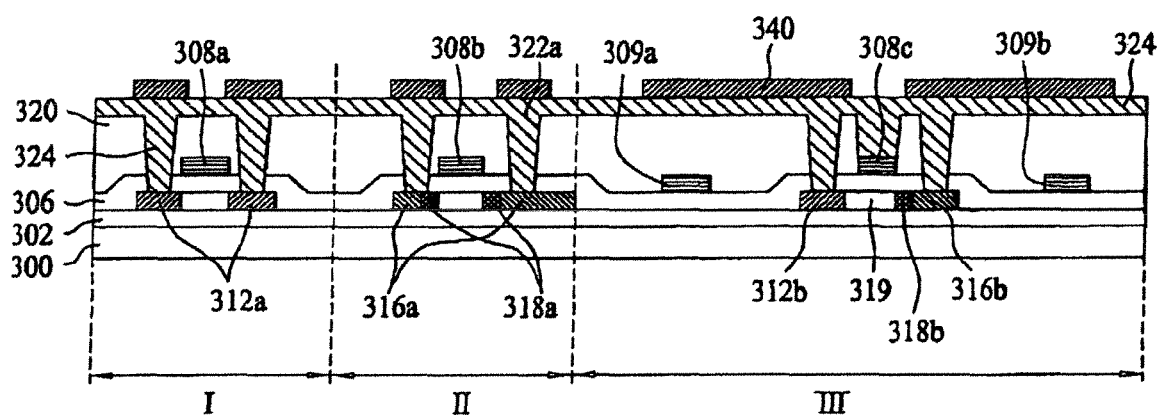
Figure 13C:
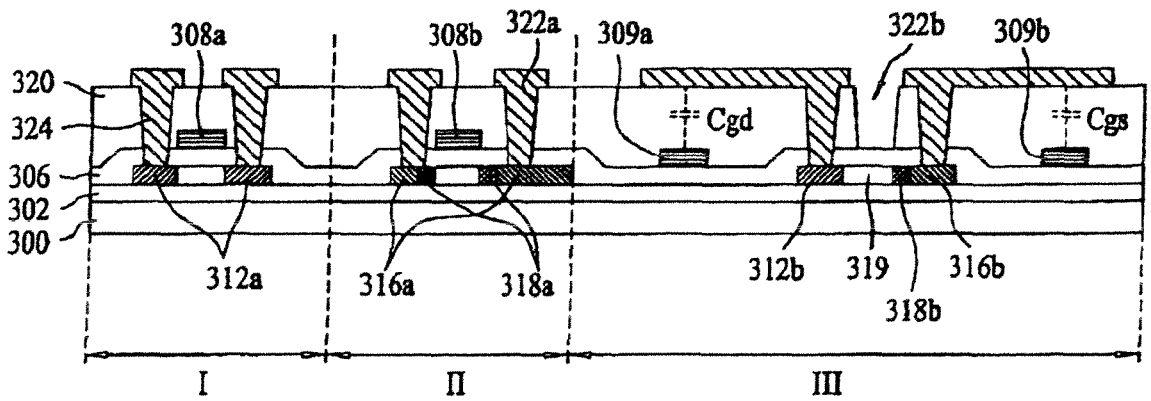

FIGS. 13A to 13C are cross section views illustrating a method of fabricating a liquid crystal display device with a photosensor according to the sixth embodiment of the present invention.

The liquid crystal display device including the photosensor according to the sixth embodiment of the present invention is formed by combining FIGS. 12A to 12D with FIGS. 8A to 8C, whereby the explanation for the liquid crystal display device according to the sixth embodiment of the present invention will be substituted by the explanation for the liquid crystal display devices according to the second and fifth embodiments of the present invention.

Figure 14A:
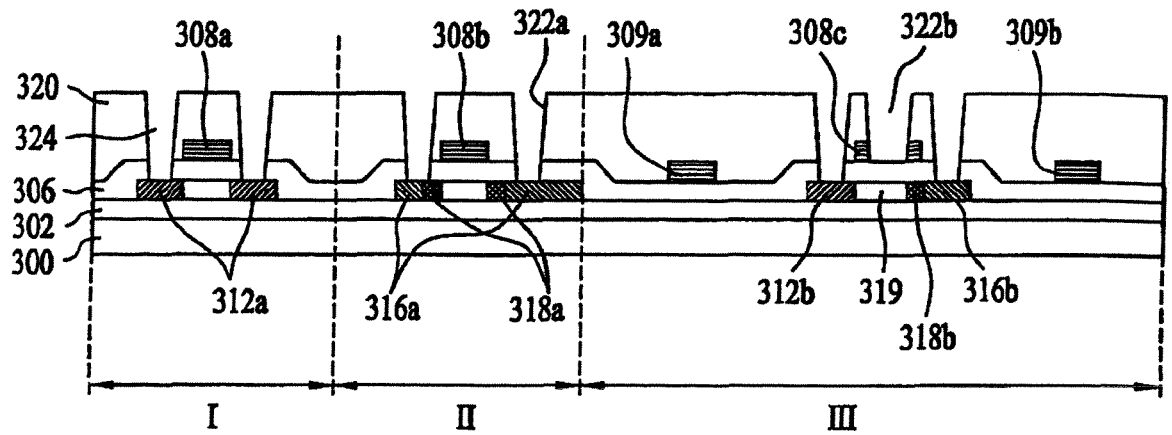
FIGS. 14A and 14B are cross section views illustrating a method of fabricating a liquid crystal display device with a photosensor according to the seventh embodiment of the present invention.
Figure 14B:
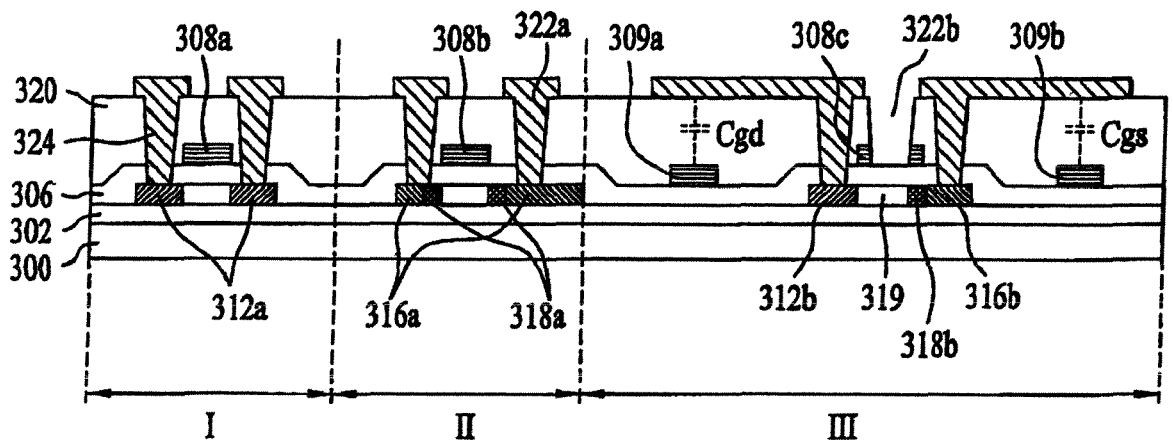

FIGS. 14A and 14B are cross section views illustrating a method of fabricating a liquid crystal display device with a photosensor according to the seventh embodiment of the present invention.

The liquid crystal display device including the photosensor according to the seventh embodiment of the present invention is formed by combining FIGS. 12A to 12D with FIGS. 9A and 9B, whereby the explanation for the liquid crystal display device according to the seventh embodiment of the present invention will be substituted by the explanation for the liquid crystal display devices according to the third and fifth embodiments of the present invention.

Figure 15A:
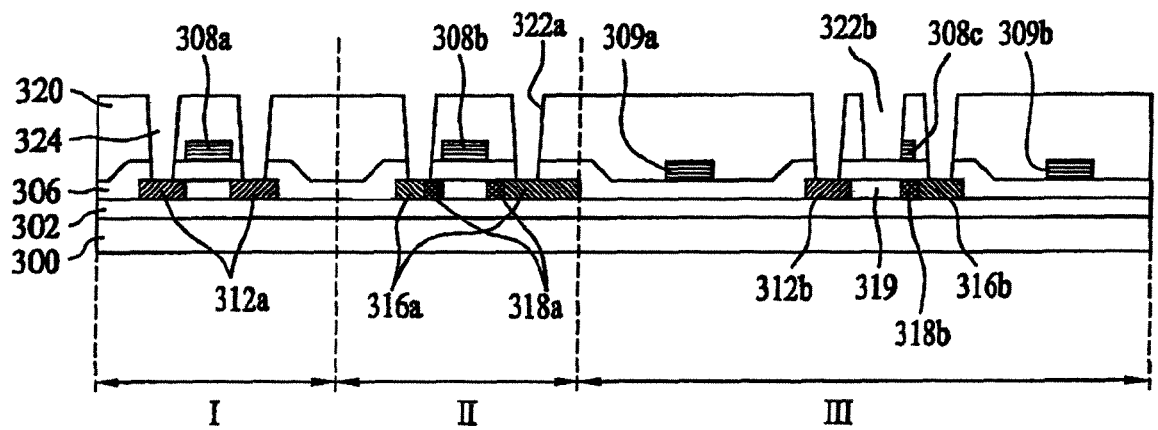
FIGS. 15A and 15B are cross section views illustrating a method of fabricating a liquid crystal display device with a photosensor according to the eighth embodiment of the present invention.
Figure 15B:
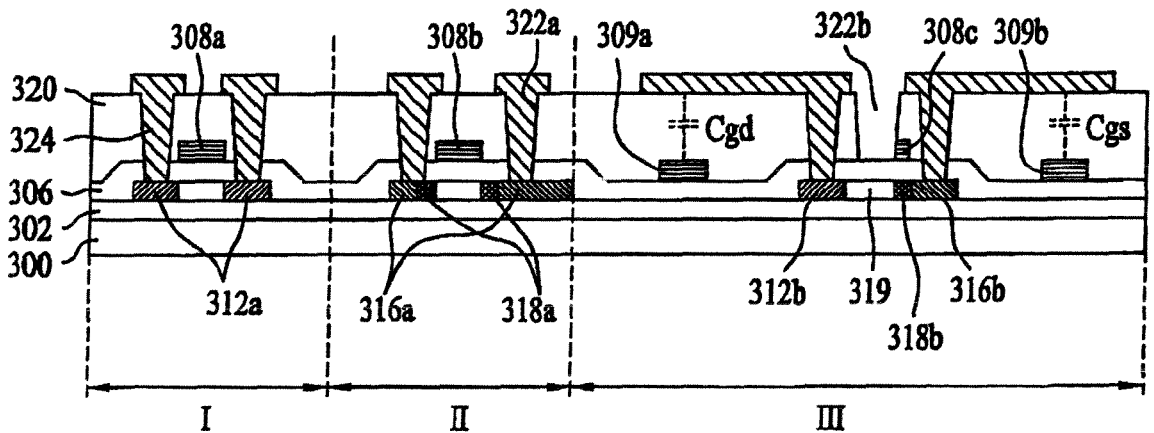

FIGS. 15A and 15B are cross section views illustrating a method of fabricating a liquid crystal display device with a photosensor according to the eighth embodiment of the present invention.

The liquid crystal display device including the photosensor according to the eighth embodiment of the present invention is formed by combining FIGS. 12A to 12D with FIGS. 10A and 10B, whereby the explanation for the liquid crystal display device according to the eighth embodiment of the present invention will be substituted by the explanation for the liquid crystal display devices according to the fourth and fifth embodiments of the present invention.

As mentioned above, the liquid crystal display device with the photosensor according to the preferred embodiment of the present invention and the method of fabricating the same have the following advantages.

In the liquid crystal display device with the photosensor according to the preferred embodiment of the present invention, the ion implanting prevention film is formed in the photosensor region on the process of forming the gate electrode of the thin film transistor, and the ion non-implantation region into which ions are not implanted is formed in the semiconductor layer of the photosensor region by using the ion implanting prevention film, thereby improving the sensing efficiency of photosensor.

Also, the first and second auxiliary capacitors prevent the change of voltage charged in the floating gate electrode of the photosensor, and the ion implanting prevention film permits formation of ion non-implantation region in the semiconductor layer of the photosensor region, thereby improving the sensing efficiency of photosensor.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating a liquid crystal display device with a photosensor comprising:
   preparing a first substrate including a color filter layer;
   preparing a second substrate including thin film transistor and photosensor regions; and
   forming a liquid crystal layer between the first and second substrates,
   wherein preparing the second substrate includes:
   forming a buffer layer on the second substrate;
   forming semiconductor layers on the buffer layer of the thin film transistor and photosensor regions;
   forming an insulation film on the second substrate to cover the semiconductor layer;

forming a gate electrode, overlapped with the semiconductor layers, on the insulation film of the thin film transistor region, and forming an ion implanting prevention film on the insulation film of the photosensor region;

forming at least one of $n^+$-type and p-type ion implantation regions in the semiconductor layer of the thin film transistor region, and forming at least one of $n^+$-type and p-type ion implantation regions, an ion non-implantation region and a lightly doped region in the semiconductor layer of the photosensor region by using the gate electrode and the ion implanting prevention film, at the same time;

forming a passivation film on an entire surface of the second substrate;

forming a first contact hole exposing source and drain regions of the semiconductor layer in the thin film transistor region and source and drain regions of the semiconductor layer in the photosensor region, and forming a second contact hole passing through the passivation film above the ion non-implantation region of the photosensor region by exposing the ion implanting prevention film or removing some or entire portions of the ion implanting prevention film; and forming a metal film on the second substrate including the first and second contact holes, and patterning source and drain electrodes connected with the semiconductor layer of the thin film transistor through the first contact hole, and source and drain electrodes connected with the semiconductor layer of the photosensor region through the first contact hole, at the same time.

2. The method of claim 1, wherein the ion implanting prevention film is completely removed on the process of forming the second contact hole.

3. The method of claim 1, wherein the ion implanting prevention film is exposed on the process of forming the second contact hole, and is completely removed on the process of patterning the source and drain electrodes.

4. The method of claim 1, wherein the central portion of the ion implanting prevention film is removed on the process of forming the second contact hole.

5. The method of claim 1, wherein the ion implanting prevention film is removed partially such that the ion implanting prevention film remains only at one lower edge of the second contact hole corresponding to the $n^+$-type ion implantation region when forming the second contact hole.

6. The method of claim 1, wherein the ion implanting prevention film and the gate electrode are formed of the same material.

7. The method of claim 1, further comprising:
forming first and second auxiliary patterns formed on the insulation film adjacent to the semiconductor layer of the photosensor region and overlapped with the source and drain electrodes.

8. The method of claim 7, wherein the ion implanting prevention film is completely removed on the process of forming the second contact hole.

9. The method of claim 7, wherein the ion implanting prevention film is exposed on the process of forming the second contact hole, and is completely removed on the process of patterning the source and drain electrodes.

10. The method of claim 7, wherein the central portion of the ion implanting prevention film is removed on the process of forming the second contact hole.

11. The method of claim 7, wherein the ion implanting prevention film is removed partially such that the ion implanting prevention film remains only at one lower edge of the second contact hole corresponding to the $n^+$-type ion implantation region when forming the second contact hole.

12. The method of claim 7, wherein the ion implanting prevention film and the gate electrode are formed of the same material.

* * * * *